US007936565B2

(12) United States Patent
Muro et al.

(10) Patent No.: US 7,936,565 B2
(45) Date of Patent: May 3, 2011

(54) ELECTRONIC APPARATUS AND FLEXIBLE PRINTED WIRING BOARD

(75) Inventors: Kiyomi Muro, Hachioji (JP); Sadahiro Tamai, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/615,064

(22) Filed: Nov. 9, 2009

(65) Prior Publication Data

US 2010/0226103 A1 Sep. 9, 2010

(30) Foreign Application Priority Data

Mar. 6, 2009 (JP) ................................ 2009-053721

(51) Int. Cl.
*H05K 1/00* (2006.01)

(52) U.S. Cl. ........ 361/749; 361/736; 361/752; 361/753; 361/803; 439/77; 439/149; 439/260; 439/493; 174/521; 29/735; 29/759

(58) Field of Classification Search .................. 361/749, 361/736, 752, 753, 803; 439/77, 149, 260, 439/493; 174/521; 29/735, 759
See application file for complete search history.

(56) References Cited

U.S. PATENT DOCUMENTS

| | | | | |
|---|---|---|---|---|
| 4,691,972 | A * | 9/1987 | Gordon | 439/77 |
| 4,811,165 | A * | 3/1989 | Currier et al. | 361/716 |
| 5,646,802 | A * | 7/1997 | Akiyama et al. | 360/244.6 |
| 5,670,994 | A * | 9/1997 | Kawaguchi et al. | 345/206 |
| 5,761,795 | A * | 6/1998 | Ohta | 29/739 |
| 6,151,284 | A * | 11/2000 | Watanabe et al. | 720/601 |
| 7,756,553 | B2 * | 7/2010 | Dinh et al. | 455/575.1 |
| 2003/0193787 | A1 * | 10/2003 | Manabe et al. | 361/752 |
| 2006/0146263 | A1 * | 7/2006 | Park et al. | 349/149 |
| 2006/0240697 | A1 * | 10/2006 | Cronch et al. | 439/260 |
| 2009/0161331 | A1 * | 6/2009 | Sato et al. | 361/803 |
| 2009/0168374 | A1 * | 7/2009 | Clayton et al. | 361/749 |
| 2009/0168384 | A1 * | 7/2009 | Goto et al. | 361/803 |

FOREIGN PATENT DOCUMENTS

| | | |
|---|---|---|
| JP | U 02-113283 | 9/1990 |
| JP | U 03-38679 | 4/1994 |
| JP | 08-510857 | 11/1996 |
| JP | 09-275285 | 10/1997 |
| JP | 2006-041361 | 2/2006 |
| JP | 2006-135183 | 5/2006 |
| JP | 2008-181066 | 8/2008 |
| WO | WO 94/28597 | 12/1994 |

OTHER PUBLICATIONS

Notice of Reasons for Rejection mailed by JPO on Jan. 5, 2010 in the corresponding Japanese patent application No. 2009-053721.
Notice of Reasons for Rejection mailed by JPO on Mar. 30, 2010 in the corresponding Japanese patent application No. 2009-053721.

* cited by examiner

*Primary Examiner* — Xiaoliang Chen
(74) *Attorney, Agent, or Firm* — Knobbe, Martens, Olson & Bear LLP

(57) ABSTRACT

According to one embodiment, an electronic apparatus includes a housing, a circuit board accommodated in the hosing and including a first surface and a second surface located on an opposite side to the first surface, a flexible printed wiring board having an elasticity, electrically connected to the circuit board and provided from the first surface of the circuit board over to the second surface, and a pressing portion formed from a part of the flexible printed wiring board as it is bent, and pressing the flexible printed wiring board towards the first surface as it is brought into contact with the inner surface of the housing, which opposes the first surface of the circuit board.

4 Claims, 8 Drawing Sheets

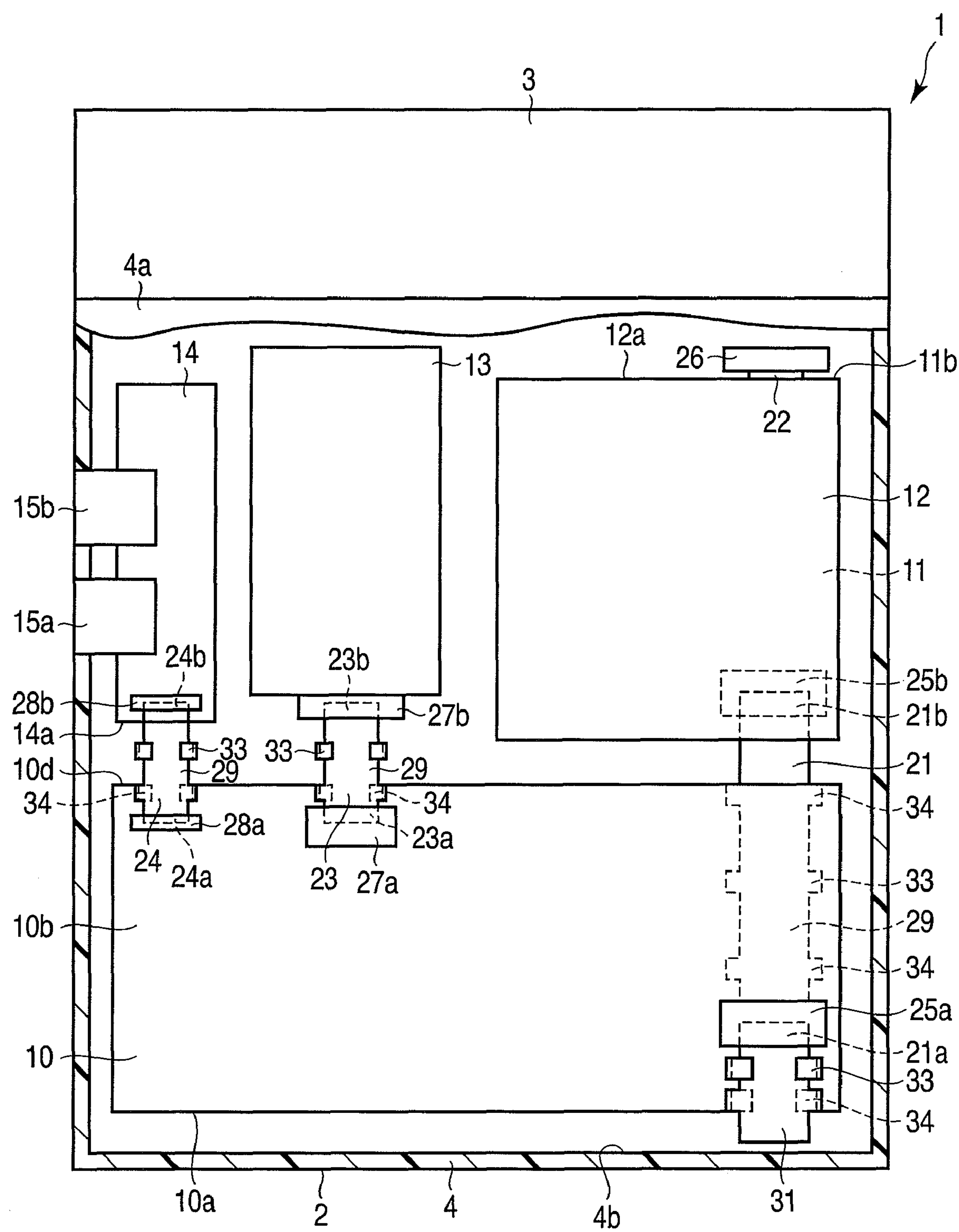
F I G. 2

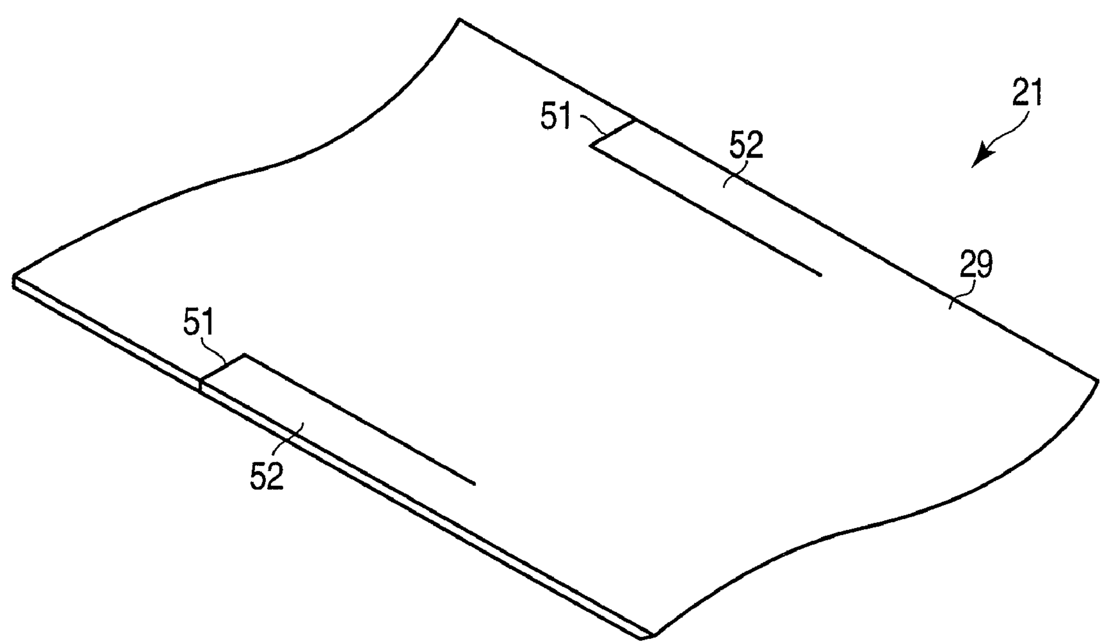
F I G. 11
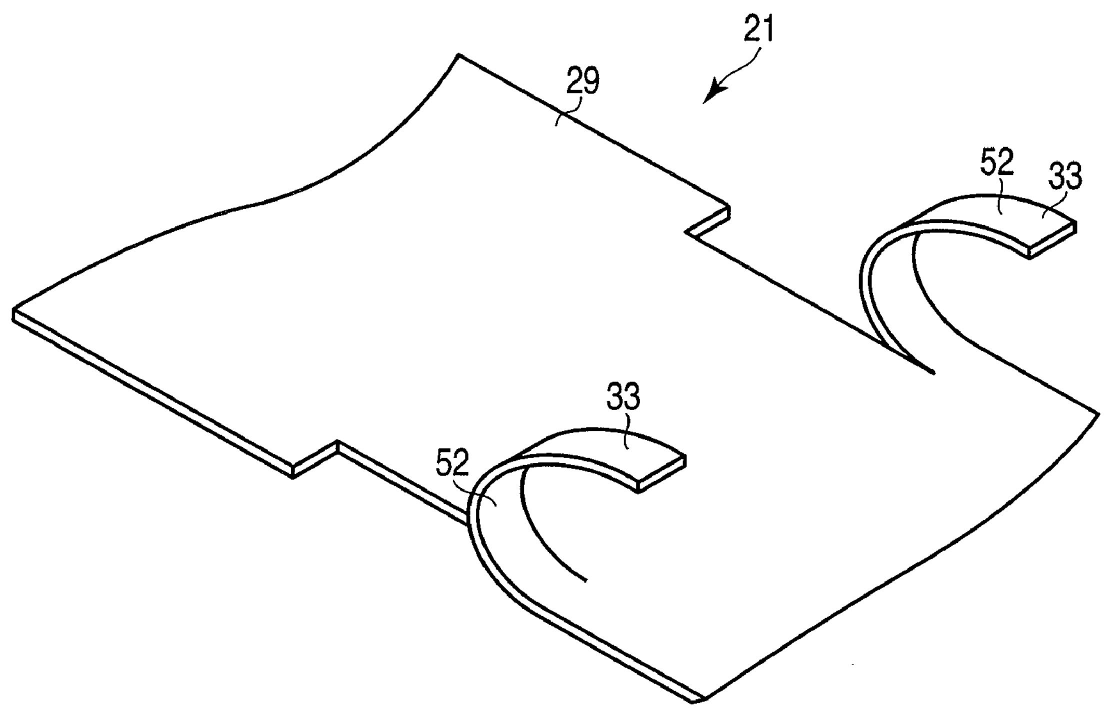
F I G. 12

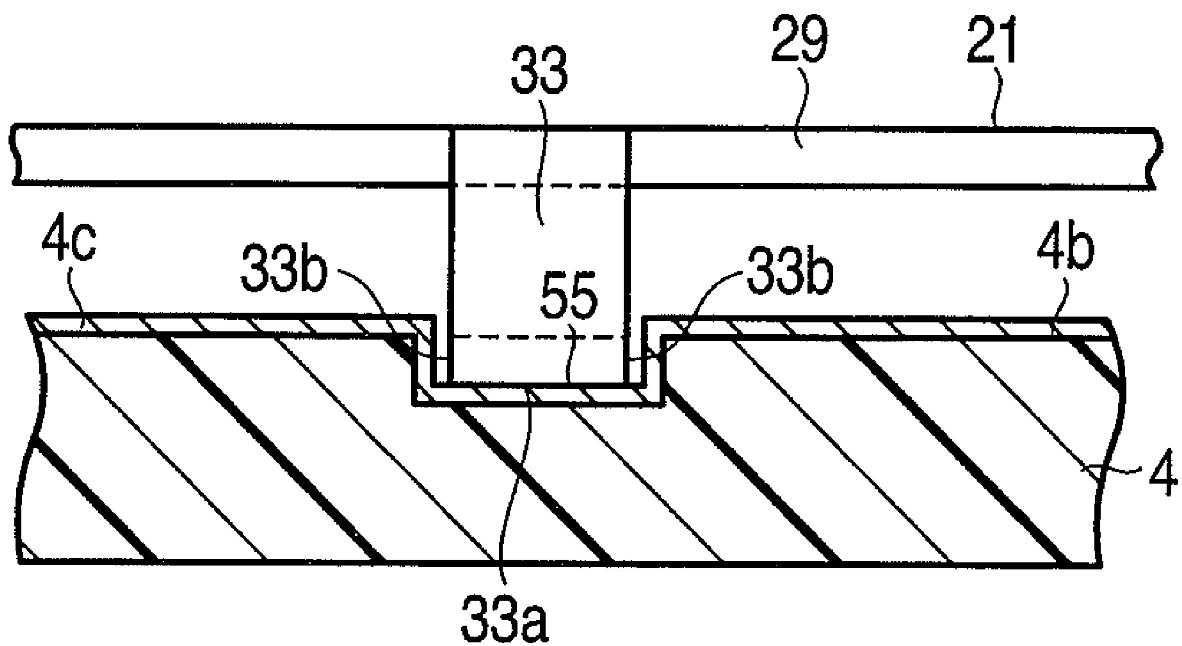
F I G. 13

ELECTRONIC APPARATUS AND FLEXIBLE PRINTED WIRING BOARD

CROSS-REFERENCE TO RELATED APPLICATIONS

This application is based upon and claims the benefit of priority from Japanese Patent Application No. 2009-053721, filed Mar. 6, 2009, the entire contents of which are incorporated herein by reference.

BACKGROUND

1. Field

One embodiment of the present invention relates to an electronic apparatus, for example, which accommodates a flexible printed wiring board inside a housing thereof.

2. Description of the Related Art

An electronic apparatus such as a portable computer accommodates various parts inside a housing thereof, such as printed circuit boards and hard disk derives. These parts accommodated in the apparatus are electrically connected to each other by flexible printed wiring boards (to be referred to as, simply, wiring boards).

Wiring boards are formed to be flat and thin, and further flexible. With these characteristics, a wiring board can be placed in a narrow gap between the housing and parts, or arranged while bending into, for example, U-letter shape so as to surround an end portion of a part.

Wiring boards have elasticity, and therefore when they are bent to be arranged as above, a restoring force (also called as springback) acts, which is a force to restore the original form. Due to the restoring force, in some case, a wiring board displaces from its desired position designed inside the housing, or a terminal portion of a wiring board accidentally detaches from the part.

As a solution to the above-described drawbacks, for example, Jpn. Pat. Appln. KOKAI Publication No. 2008-181066 discloses an electronic apparatus in which a projection portion is formed on a wiring board such as to projects in a width direction of the board. As the projecting portion is fit in a recess portion formed in the housing, the wiring board is secured at the desired position. Further, in the conventional electronic apparatus, a grounding pattern is provided on the projecting portion. As the projecting portion is sandwiched between the two outer frames, the wiring board is grounded to the housing via the grounding pattern.

In some cases, depending on the packaging structure, a wiring board is arranged in a gap formed between the inner surface of the housing and parts. With this structure, the wiring board, which has flexibility as mentioned above, may move within the gap. Therefore, in the case where, for example, the terminal portions of the wiring board are connected incompletely to the parts, there are possibilities that a terminal portion of the wiring board accidentally detaches from the parts even if a projection portion is provided on the wiring board as discussed in Jpn. Pat. Appln. KOKAI Publication No. 2008-181066.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 2 is an exemplary plan view of the portable computer according to the first embodiment, showing the main body thereof partially cutaway;

FIG. 11 is an exemplary perspective view of a flexible printed wiring board according to the third embodiment;

FIG. 12 is an exemplary perspective view of the flexible printed wiring board according to the third embodiment while the pressed portion being bent; and FIG. 13 is an exemplary cross section of a portable computer according to the fourth embodiment, showing the positions of the flexible printed wiring board and the engaging portion of the housing in relation to each other.

DETAILED DESCRIPTION

Various embodiments according to the invention will be described hereinafter with reference to the accompanying drawings. In general, according to one embodiment of the invention, an electronic apparatus includes a housing, a circuit board accommodated in the hosing and including a first surface and a second surface located on an opposite side to the first surface, a flexible printed wiring board having an elasticity, electrically connected to the circuit board and provided from the first surface of the circuit board over to the second surface, and a pressing portion formed from a part of the flexible printed wiring board as it is bent, and pressing the flexible printed wiring board towards the first surface as it is brought into contact with the inner surface of the housing, which opposes the first surface of the circuit board.

The first embodiment of the present invention will now be described with reference to FIGS. 1 to 8.

Figure 1:
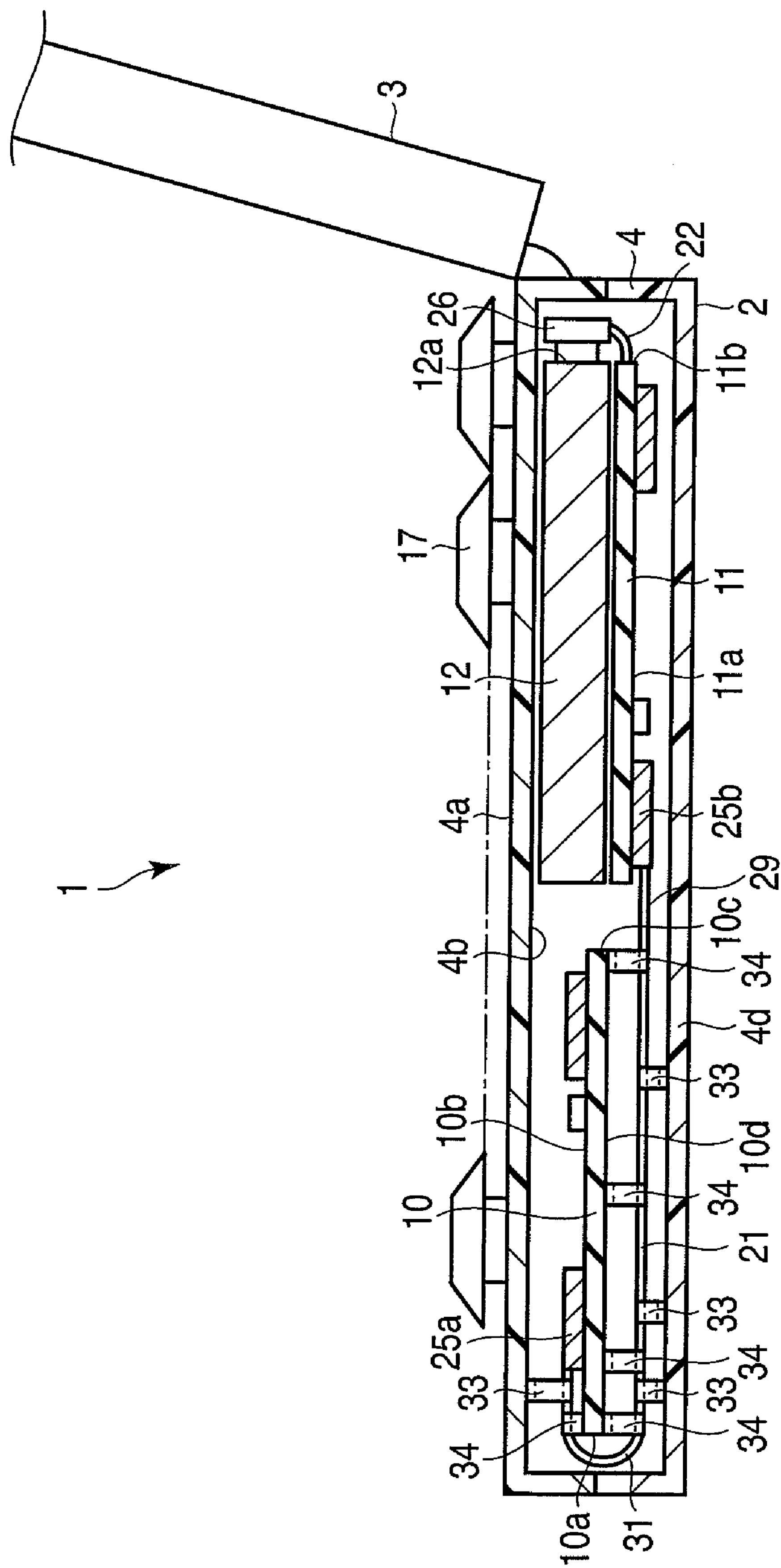
FIG. 1 is an exemplary cross section of a portable computer according to the first embodiment.

FIGS. 1 and 2 each show a portable computer 1 as an example of the electronic apparatus. The portable computer 1 includes a computer main body 2 and a display module 3.

The main body 2 includes a housing 4 made of, for example, a synthetic resin. As shown in FIG. 2, the housing 4 accommodates main structural elements, for example, a motherboard 10, a sub board 11, an optical disk drive (to be referred to as, simply, ODD) 12, a hard disk drive (to be referred to as, simply, HDD) 13 and a connecting board 14.

A CPU is installed on the motherboard 10. USB connectors 15*a* and 15*b* are provided on the connecting board 14.

The motherboard 10 is an example of circuit boards. The motherboard 10, sub board 11, ODD 12, HDD 13 and connecting board 14 are examples of the accommodated parts.

The housing 4 includes a flat upper surface 4*a*, and a keyboard 17 is supported on a central portion of the upper surface 4*a*. An inner surface 4*b* of the housing 4 is covered with a conducting layer 4*c*. With this structure, the housing 4 is made electro-conductive. It should be noted that, in place of forming the conductive layer 4*c*, the housing 4 can be made conductive by forming the housing 4 of an electro-conductive material.

The display module 3 is supported on a rear end portion of the housing 4. The display module 3 is pivotable between the close position where it is folded on the main body 2 of the computer and an open position where it rises from the rear end of the main body 2.

As shown in FIG. 2, the motherboard 10 and the sub board 11 are electrically connected to each other via a first flexible printed wiring board (to be called as, simply, the first wiring board, hereinafter) 21. The first wiring board 21 is built across the motherboard 10 and the sub board 11.

The sub board 11 and the ODD 12 are electrically connected to each other via a second flexible printed wiring board (to be called as, simply, the second wiring board, hereinafter) 22. The second wiring board 22 is built across the sub board 11 and the ODD 12.

The motherboard 10 and the HDD 13 are electrically connected to each other via a third flexible printed wiring board (to be called as, simply, the third wiring board, hereinafter) 23. The third wiring board 23 is built across the motherboard 10 and the HDD 13.

The motherboard 10 and the connecting board 14 are electrically connected to each other via a fourth flexible printed wiring board (to be called as, simply, the fourth wiring board, hereinafter) 24. The fourth wiring board 24 is built across the motherboard 10 and the connecting board 14.

The first wiring board 21, the second wiring board 22, the third wiring board 23 and the fourth wiring board 24 have different lengths and shapes from each other. Each of the wiring boards 21 to 24 includes a flat, thin and flexible substrate 29. Since the substrate 29 has elasticity, a restoring force acts which naturally tries to restore its original shape when it is bent.

Both end portions of the first wiring board 21 are provided with the terminal portions 21*a* and 21*b*, respectively. In the front end portion 10*a* of the motherboard 10, a connector 25*a* is mounted on the upper surface 10*b* serving as the first surface of the motherboard 10. One of the terminal portions, that is, the terminal portion 21*a* is electrically connected to the connector 25*a*, whereas the other terminal portion 21*b* is electrically connected to the connector 25*b* mounted on the lower surface 11*a* of the sub board 11.

One of the end portions of the second wiring board 22 is electrically connected to the rear end portion 11*b* of the sub board 11. The other end portion of the second wiring board 22 is electrically connected to the connector 26 mounted on the rear end portion 12*a* of the ODD 12.

Both end portions of the third wiring board 23 are provided with the terminal portions 23*a* and 23*b*, respectively. One of the terminal portions, that is, the terminal portion 23*a* is electrically connected to the connector 27*a* mounted on the upper surface of the rear end portion 10*c* of the motherboard 10. The other terminal portion 23*b* is electrically connected to the connector 27*b* mounted on the front end of the HDD 13.

Both end portions of the fourth wiring board 24 are provided with the terminal portions 24*a* and 24*b*, respectively. A connector 28*a* is mounted on the upper surface of the rear end portion 10*c* of the motherboard 10, whereas a connector 28*b* is mounted on the upper surface of the front end portion 14*a* of the connecting board 14. One of the terminal portions, terminal portion 24*a* is electrically connected to the connector 28*a*, whereas the other terminal portion 24*b* is electrically connected to the connector 28*b*.

Figure 3:
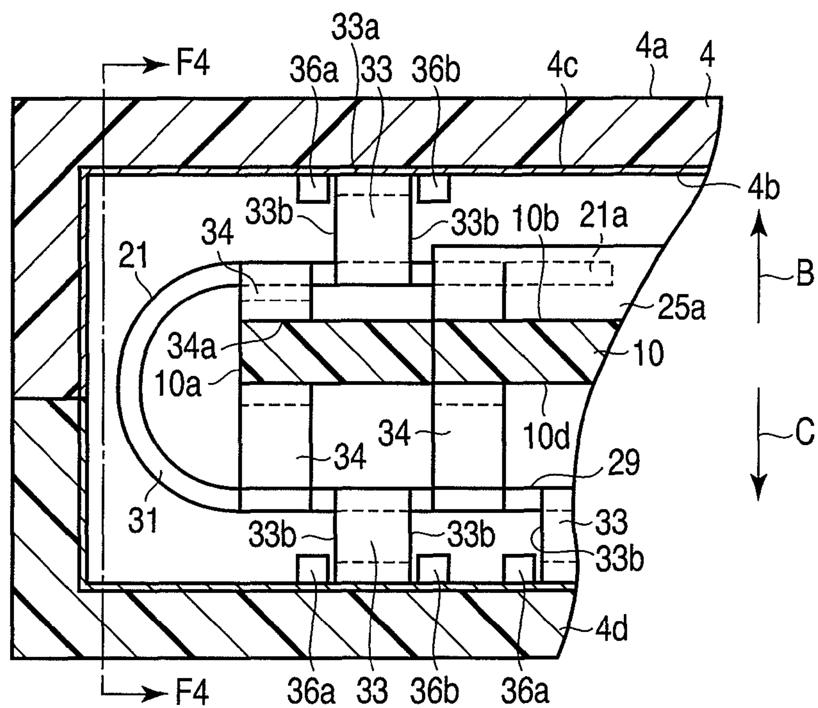
FIG. 3 is an exemplary cross section of the portable computer according to the first embodiment, showing the vicinity of the bent portion of the flexible printed wiring board viewed from a side of the housing.
Figure 4:
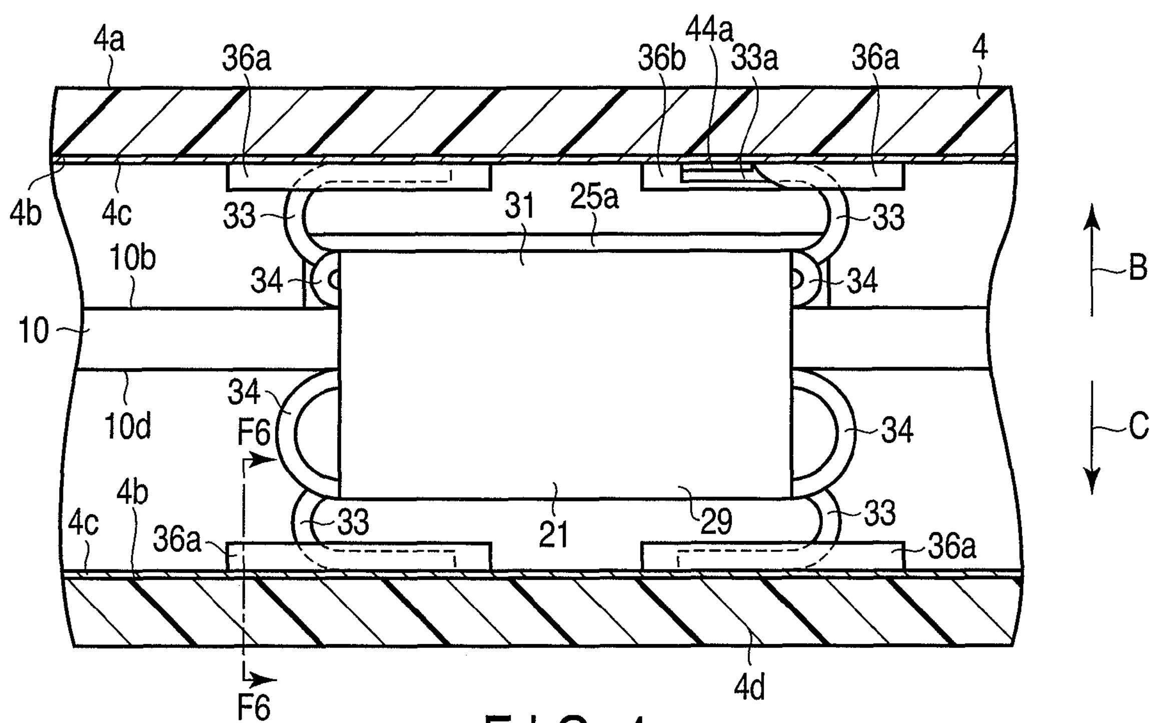
FIG. 4 is an exemplary cross section of the portable computer according to the first embodiment, showing the vicinity of the bent portion of the flexible printed wiring board viewed from the front side of the housing.

As shown in FIGS. 3 and 4, the first wiring board 21 includes a bending portion 31 at a position adjacent to the terminal portion 21*a*. The bending portion 31 is formed to be bent into an arc-shape to surround the front end portion 10*a* of the motherboard 10.

More specifically, the bending portion 31 of the first wiring board 21 is bent in the front end portion 10*a* of the motherboard 10 to draw a smooth arc form the upper surface 10*b* of the motherboard 10 towards the lower surface 10*d* serving as the second surface of the motherboard 10. With this structure, the portion of the first wiring board 21, which connects the bending portion 31 to the other terminal portion 21*b*, is wired while being put through between the motherboard 10 and the bottom wall 4*d* of the housing 4.

Figure 5:
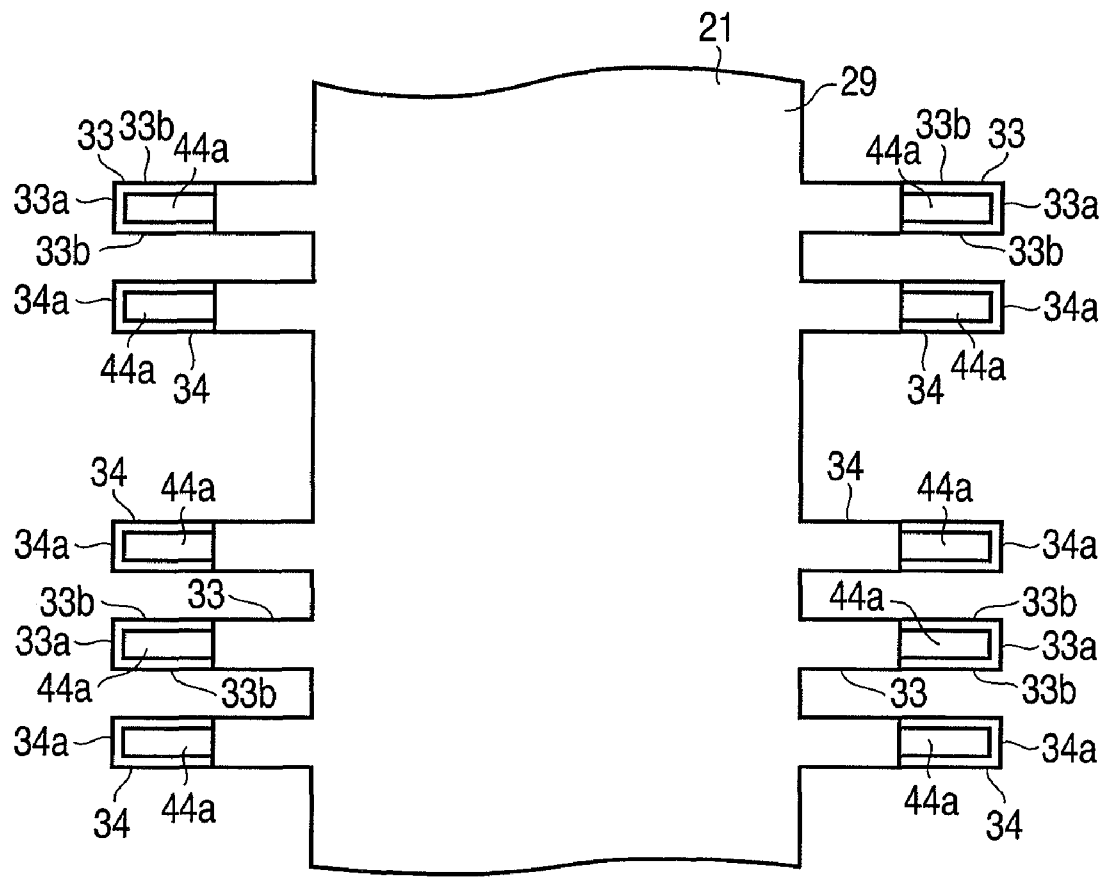
FIG. 5 is an exemplary plan view of the flexible printed wiring board according to the first embodiment.

FIG. 5 shows a part of the first wiring board 21. The first wiring board 21 includes a plurality of pressing portions 33 and a plurality of other pressing portions 34. The pressing portions 33 and the other pressing portions 34 are part of the substrate 29 of the first wiring board 21, and they have elasticity.

The pressing portions 33 extend from one side edge and the other side edge along the longitudinal direction of the first wiring board 21 and respectively towards the width direction of the first wiring board 21. Similarly, the other pressing portions 34 extend from one side edge and the other side edge along the longitudinal direction of the first wiring board 21 and respectively towards the width direction of the first wiring board 21. With this arrangement, the pressing portions 33 and the other pressing portions 34 each form a stripe shape.

Each pressing portion 33 and each respective other pressing portion 34 are arranged to be adjacent to each other. In other words, the pressing portions 33 and the other pressing portions 34 are arranged to be alternate in the longitudinal direction of the first wiring board 21. Note that this arrangement does not apply to those of the pressing portions 33 and the other pressing portions 34 located to be distant from each other via the bending portion 31.

As shown in FIGS. 3 and 4, the pressing portions 33 are each bent towards the inner surface 4*b* of the housing 4 which opposes the upper surface 10*b* of the motherboard 10. The pressing portions 33 are bent into a habit of so before the first wiring board 21 is built into the housing 4.

The pressing portions 33 have elasticity and therefore a restoring force acts while they are bent. Due to the restoring force, the distal end portion 33*a* of each of the pressing portions 33 is elastically brought into contact with the inner surface 4*b* of the housing 4.

As shown in FIGS. 3 and 4, the other pressing portions 34 are each bent towards the upper surface 10*b* and lower surface 10*d* of the motherboard 10. The other pressing portions 34 are bent into a habit of so before the first wiring board 21 is built into the housing 4.

The other pressing portions 34 have elasticity and therefore a restoring force acts while they are bent. Due to the restoring force, the distal end portion 34*a* of each of the pressing portions 34 is elastically brought into contact with the upper surface 10*b* and lower surface 10*d* of the motherboard 10.

In more detail, as shown in FIG. 3, each pressing portion 33 is provided to be close to the connector 25*a* above the motherboard 10, that is, between the connector 25*a* and the bending portion 31. As the restoring force acts in the direction indicated by arrow B in FIGS. 3 and 4, the pressing portion 33 is brought into contact with the inner surface 4*b* of the housing 4.

Each of the other pressing portions 34 is provided to be close to the front end portion 10*a* of the motherboard 10 above the motherboard 10. As the restoring force acts in the direction indicated by arrow C in FIGS. 3 and 4, the other pressing portion 34 is brought into contact with the upper surface 10*b* of the mother board 10.

Below the motherboard 10, the other pressing portions 34 are arranged to be distant from each other from the location where they become close to the front end portion 10*a* of the motherboard 10. As the restoring force acts in the direction indicated by arrow B in FIGS. 3 and 4, the other pressing portions 34 are brought into contact with the lower surface 10*d* of the motherboard 10.

Below the motherboard 10, each of the pressing portions 33 is arranged between an adjacent pair of the other pressing portions 34. As the restoring force acts in the direction indicated by arrow C in FIGS. 3 and 4, the pressing portions 33 are brought into contact with the inner surface 4*b* of the housing 4.

Figure 6:
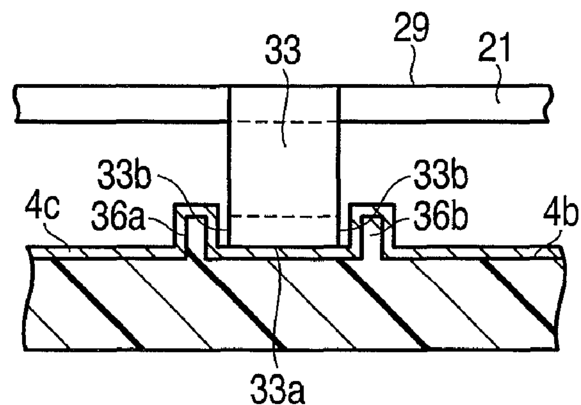
FIG. 6 is an exemplary cross section of the portable computer according to the first embodiment, showing the positions of the pressed portion of the flexible printed wiring board and the engaging portion of the housing in relation to each other.

As shown in FIGS. 3, 4 and 6, the housing 4 includes a plurality of engaging portions 36*a* and 36*b*. The engaging portions 36*a* and 36*b* project from the inner surface 4*b* of the housing 4. The engaging portions 36*a* and 36*b* are arranged to be in parallel to each other with an interval larger than the width of the pressing portion 33 therebetween.

It is desirable that the engaging portions 36*a* and 36*b* should project from the inner surface 4*b* of the housing 4 higher than the thickness of the pressing portion 33. The side edges 33*b* of the distal end portion 33*a* of the pressing portion 33 engage with the engaging portions 36*a* and 36*b*.

Figure 7:
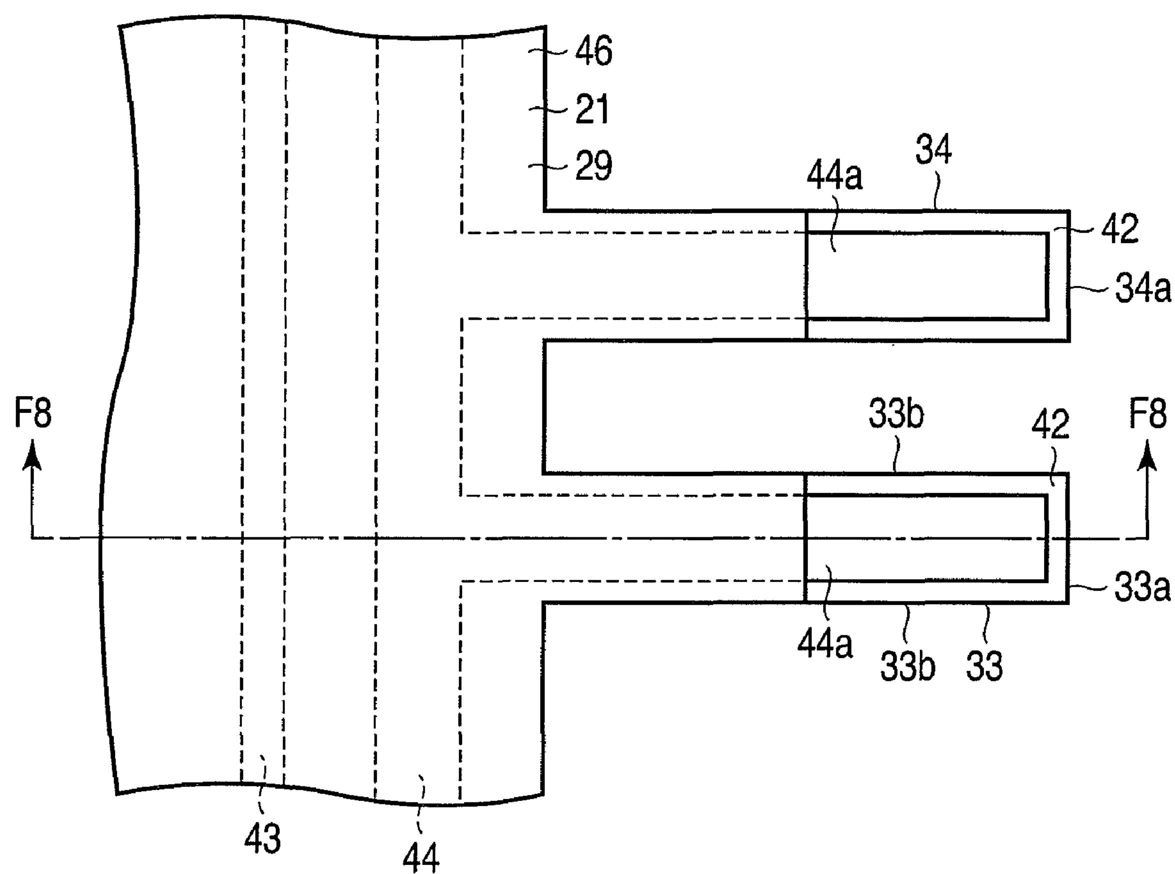
FIG. 7 is an exemplary plan view of the pressed portion of the flexible printed wiring board according to the first embodiment.
Figure 8:
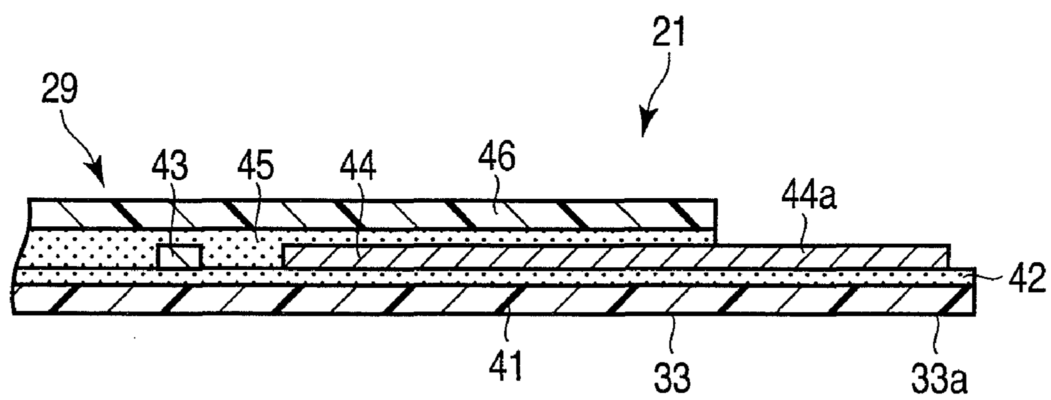
FIG. 8 is an exemplary cross section taken along the line F8-F8 in FIG. 7.

FIG. 7 shows a partial enlarged view of the first wiring board 21. FIG. 8 shows a cross section of the first wiring board 21 including the pressing portion 33. The following descriptions are made in connection with the pressing portion 33 only, but note that the other pressing portion 34 has a similar structure to that of the pressing portion 33.

The substrate 29 of the first wiring board 21 includes the first insulating layer 41, the first adhering layer 42, a signal pattern 43, a grounding pattern 44, the second adhesive layer 45 and the second insulating layer 46.

The signal pattern 43 and grounding pattern 44 are each made of a copper foil, and they are laminated on the first insulating layer 41 via the first adhesive layer 42. The signal pattern 43 and the grounding pattern 44 are provided continuously in the longitudinal direction of the first wiring board 21.

The second insulating layer 46 is laminated on the signal pattern 43 and the grounding pattern 44 via the second adhesive layer 45. With this arrangement, the first and second insulating layers 41 and 46 are formed to cover the signal pattern 43 and the grounding pattern 44.

The signal pattern 43 and the grounding pattern 44 have more tendency of maintaining their shapes when they are bent than that of the first insulating layer 41 and second insulating layer 46. The first insulating layer 41 and second insulating layer 46 each have a restoring force larger than those of the signal pattern 43 and the grounding pattern 44 when they are bent.

As shown in FIGS. 7 and 8, the grounding pattern 44 includes a plurality of extended portions 44*a* extending towards the distal end portion 33*a* of the pressing portion 33 and the distal end portion 34*a* of the other pressing portion 34.

In the distal end portion 33*a* of the pressing portion 33, the second adhesive layer 45 and the second insulating layer 46 are cut such as to expose the extended portion 44*a* of the grounding pattern 44. Similarly, in the distal end portion 34*a* of the other pressing portion 34, the second adhesive layer 45 and the second insulating layer 46 are cut such as to expose the extended portion 44*a* of the grounding pattern 44.

In other words, the ground pattern 44 is exposed to the outside of the first wiring board 21 at the position corresponding to the distal end portion 33*a* of the pressing portion 33 and the distal end portion 34*a* of the other pressing portion 34.

As shown in FIG. 4, the extended portion 44*a* of the grounding pattern 44 is exposed from the distal end portion 33*a* of the pressing portion 33. The extended portion 44*a* of the pressing portion 33 is brought into contact with the conductive layer 4*c* which covers the inner surface 4*b* of the housing 4. With this arrangement, the grounding pattern 44 is electrically connected to the conductive layer 4*c* of the housing 4.

The other extended portion 44*a* of the grounding pattern 44 is exposed from the distal end portion 34*a* of the other pressing portion 34. The extended portion 44*a* of the other pressing portion 34 is situated on an opposite side to the motherboard 10 when the other pressing portion 34 is bent towards the motherboard 10.

That is, in the distal end portion 34*a* of the other pressing portion 34, the first insulating layer 41 is brought into contact with the motherboard 10, thereby avoiding contact between the extended portion 44*a* of the grounding pattern 44 and the motherboard 10.

It is alternatively possible that a grounding pad is formed at a position of the motherboard 10 where the distal end portion 34*a* of the other pressing portion 34 is brought into contact, and the extended portion 44*a* of the other pressing portion 34 is brought into contact with the grounding pad.

As shown in FIG. 1, below the motherboard 10, the pressing portion 33 is bent towards the inner surface 4*b* of the housing 4, and elastically brought into contact with the inner surface 4*b*. The other pressing portion 34 is bent towards the motherboard 10, and elastically brought into contact with the lower surface 10*d* of the motherboard 10.

As shown in FIG. 2, the third wiring board 23 and the fourth wiring board 24 each include the pressing portions 33 and the other pressing portions 34, which are parts of the substrate 29. The pressing portions 33 of the third wiring board 23 and the pressing portions 33 of the fourth wiring board 24 are elastically brought into contact with the inner surface 4*b* of the housing 4. On the other hand, the other pressing portions 34 of the third wiring board 23 and the other pressing portions 34 of the fourth wiring board 24 are elastically brought into contact with the upper surface 10*b* of the motherboard 10.

Next, the operation of the portable computer 1 and the first wiring board 21 will now be described.

As shown in FIG. 3, the first wiring board 21 is bent at the bending portion 31. The portion of the first wiring board 21, which is located above the motherboard 10, exhibits its restoring force in the direction indicated by arrow B in FIGS. 3 and 4.

The pressing portion 33 located adjacent to the connecting portion between the terminal portion 21*a* of the first wiring board 21 and the connector 25*a* is bent towards the inner surface 4*b* of the housing 4. The pressing portion 33 exhibits its restoring force in the direction indicated by arrow B, thereby being elastically brought into contact with the inner surface 4*b* by its distal end portion 33*a*.

The pressing portion 33, due to its counteraction, presses the first wiring board 21 down in the direction indicated by arrow C in FIGS. 3 and 4. In other words, the pressing portion 33 presses the first wiring board 21 towards the upper surface 10*b* of the motherboard 10. Here, due to the restoring force of the pressing portion 33 acting in the direction indicated by arrow C, the restoring force of the first wiring board 21 acting in the direction indicated by arrow B is cancelled out.

In the vicinity of the front end portion 10*a* of the motherboard 10, the other pressing portion 34 provided to be close to the front end portion 10*a* is bent towards the motherboard 10.

The other pressing portion 34 located above the motherboard 10 exhibits its restoring force in the direction indicated by arrow C. Thus, the distal end portion 34*a* of the other pressing portion 34 is elastically brought into contact with the upper surface 10*b* of the motherboard 10. The other pressing portion 34 located below the motherboard 10 exhibits its restoring force in the direction indicated by arrow B. Thus, the distal end portion 34*a* of the other pressing portion 34 is elastically brought into contact with the lower surface 10*d* of the motherboard 10.

The other pressing portion 34 located above the motherboard 10 due to its counteraction, presses the first wiring board 21 down in the direction indicated by arrow B, which is a direction away from the motherboard 10. On the other hand, the other pressing portion 34 located below the motherboard 10 due to its counteraction, presses the first wiring board 21 down in the direction indicated by arrow C, which is a direction away from the motherboard 10.

As these other pressing portions 34 exhibit the restoring force in such a direction to separate the first wiring board 21 away from the motherboard 10, the first wiring board 21 maintains a predetermined distance with respect to the motherboard 10.

These other pressing portions 34 function as a spacer to maintain the distance between the first wiring board 21 and the motherboard 10. The bending radius of the bending portion 31 is determined based on the restoring force of the other pressing portions 34 acting on the motherboard 10.

The pressing portions 33 located below the motherboard 10 exhibit their restoring force in the direction indicated by arrow C, thereby being elastically brought into contact with the inner surface 4*b* of the housing 4. On the other hand, the other pressing portions 34 located below the motherboard 10 exhibit their restoring force in the direction indicated by arrow B, thereby being elastically brought into contact with the lower surface 10*d* of the motherboard 10.

The pressing portions 33 located below the motherboard 10 due to the counteraction, press the first wiring board 21 in the direction indicated by arrow B, which is such a direction to separate the first wiring board 21 away from the housing 4. As the pressing portions 33 exhibit the restoring force in such a direction to separate the first wiring board 21 away from the housing 4, the first wiring board 21 maintains a predetermined distance with respect to the hosing 4. In other words, the pressing portions 33 function as a spacer between the first wiring board 21 and the housing 4.

The other pressing portions 34 located below the motherboard 10 due to the counteraction, press the first wiring board 21 in the direction indicated by arrow C, which is such a direction to separate the first wiring board 21 away from the motherboard 10. As the other pressing portions 34 exhibit the restoring force in such a direction to separate the first wiring board 21 away from the motherboard 10, the first wiring board 21 maintains a predetermined distance with respect to the motherboard 10. In other words, the other pressing portions 34 function as a spacer between the first wiring board 21 and the motherboard 10.

The engaging portions 36*a* and 36*b* engage with the side edges 33*b* of the pressing portion 33 to be hooked thereon. In this manner, the movement of the pressing portion 33 in the longitudinal direction of the first wiring board 21 is limited.

As shown in FIG. 4, the grounding pattern 44 of the first wiring board 21 is electrically connected to the conductive layer 4*c* of the housing 4 in the extended portion 44*a* of the grounding pattern 44. With this arrangement, the grounding pattern 44 of the first wiring board 21 is grounded via the conductive layer 4*c* of the housing 4.

Next, the effect of the portable computer 1 and the first wiring board 21 will now be described.

The pressing portion 33 cancels out the restoring force of the first wiring board 21 bent at the bending portion 31 to restore its original shape. In this manner, it is possible to prevent the first wiring board 21 from being pulled in a direction away from the connector 25*a* due to the restoring force.

As a result, it becomes possible to prevent the terminal portion 21*a* of the first wiring board 21 from being removed from the connector 25*a* even if, for example, the connection between the connector 25*a* and the terminal portion 21*a* of the first wiring board 21 is incomplete.

In the vicinity of the front end portion 10*a* of the motherboard 10, the other pressing portions 34, due to the restoring force, maintain the distance between the first wiring board 21 and the motherboard 10. Further, the bending radium of the bending portion 31 can be adjusted by regulating the restoring force of the other pressing portions 34 acting on the motherboard 10.

As a result, it becomes possible to prevent possible damages or disconnection which may occur as the first wiring board 21 directly hitting the motherboard 10 while building the first wiring board 21 into the housing 4.

Below the motherboard 10, the pressing portions 33, due to the restoring force, maintain the distance between the first wiring board 21 and the housing 4. Similarly, the other pressing portions 34, due to the restoring force, maintain the distance between the first wiring board 21 and the motherboard 10. In this manner, the first wiring board 21 can maintain its distance with respect to the hosing 4 as well as its distance with the motherboard 10.

The distal end portion 33*a* of the pressing portion 33 engages with the engaging portions 36*a* and 36*b* of the housing 4 to be hooked thereon. With this arrangement, it is possible to prevent the first wiring board 21 being displaced in a longitudinal direction even if the first wiring board 21 is pulled by the restoring force. As a result, the shape of the first wiring board 21 can be kept in a better condition.

The pressing portions 33 and the other pressing portions 34 are bent into a habit of so before the first wiring board 21 is built into the housing 4. With this arrangement, the building of the first wiring board 21 into the housing 4 is facilitated.

As described above, the pressing portions 33 and the other pressing portions 34 control the restoring force of the bent first wiring board 21 to restore its original shape, and maintain the distance between the first wiring board 21 and the housing 4 as well as the distance between the first wiring board 21 and the motherboard 10. As a result, the shape of the first wiring board 21 can be easily maintained while it is built into the housing 4.

Further, the pressing portions 33 and the other pressing portions 34 are brought into contact with the housing 4 and the motherboard 10 elastically, and therefore if a shock is applied to the portable computer 1 from outside, the impactive force to act on the first wiring board 21 can be absorbed.

The grounding pattern 44 of the first wiring board 21 is electrically connected to the conductive layer 4*c* of the housing 4. With this arrangement, the grounding pattern 44 can be grounded via the housing 4, thereby making it possible to ground the portable computer 1 better.

In addition, by changing the ratio of the signal pattern 43 and grounding pattern 44 formed of, for example, a copper foil, the characteristic of the elasticity of each of the first wiring board 21, the pressing portions 33 and the other pressing portions 34 can be adjusted.

For example, when the ratio of the signal pattern 43 and grounding pattern 44 is increased, the shape, once it has been made a habit, is maintained better. By contrast, when the ratio of the signal pattern 43 and grounding pattern 44 is decreased, the restoring force acting when the board is bent is increased. In this manner, the contacting pressure of the pressing portions 33 against the housing 4 can be adjusted.

Further, by changing the thickness of each of the first insulating layer 41, the first adhesive layer 42, the signal pattern 43, the grounding pattern 44, the second adhesive layer 45 and the second insulating layer 46, the characteristic of the elasticity of the pressing portions 33 and the other pressing portions 34 can be adjusted.

Furthermore, by changing the width or length of the pressing portions 33 and the other pressing portions 34, the characteristic of the elasticity of the pressing portions 33 and the other pressing portions 34 can be adjusted.

It should be noted that due to the presence of the pressing portions 33 and the other pressing portions 34, a similar advantageous effect to the first wiring board 21 can be obtained in the third wiring board 23 and the fourth wiring board 24 as well.

Note that the present invention is not limited to the first embodiment described so far, but it can be modified, when they are actually carried out, into various versions as long as the essence of the invention remains within its scope.

Figure 9:
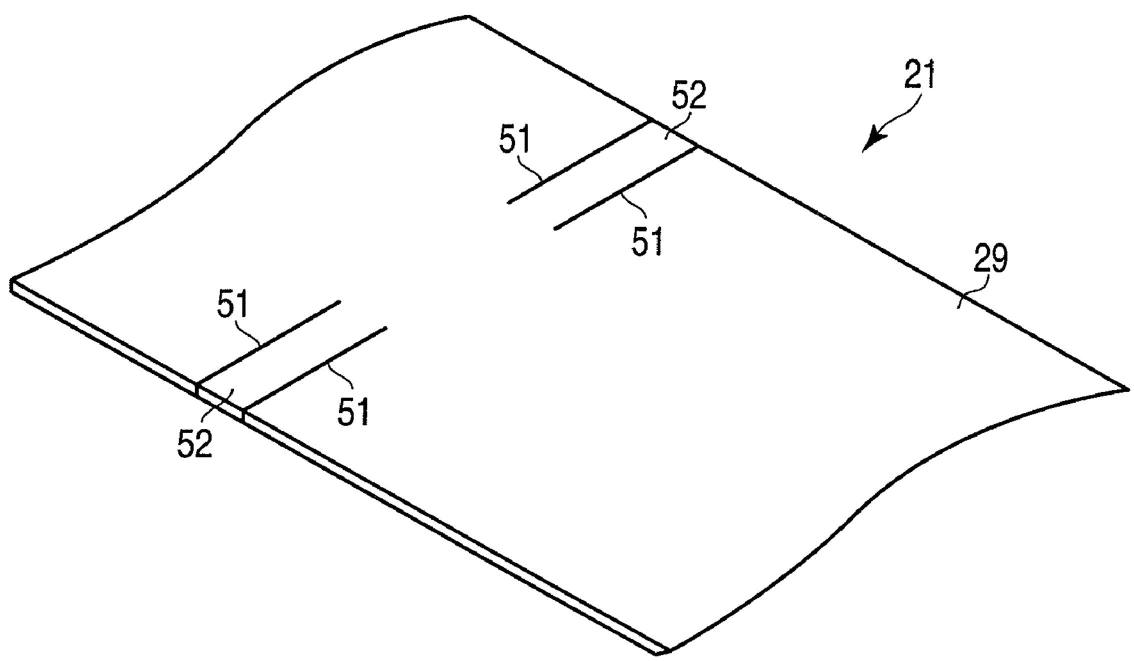
FIG. 9 is an exemplary perspective view of a flexible printed wiring board according to the second embodiment.
Figure 10:
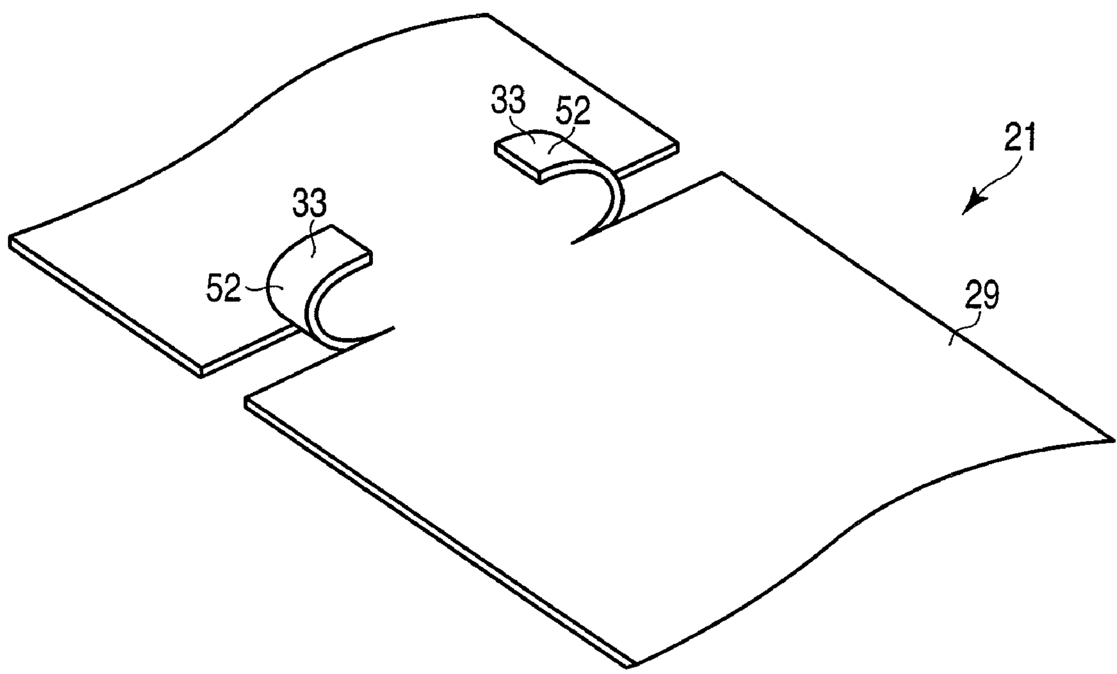
FIG. 10 is an exemplary perspective view of the flexible printed wiring board according to the second embodiment while the pressed portion being bent.

FIGS. 9 and 10 show a first wiring board 21 according to the second embodiment. As shown in FIG. 9, a substrate 29 of the first wiring board 21 has a plurality of cuts 51 made therein. The cuts 51 are made from one side edge and the other side edge along the longitudinal direction of the first wiring board 21 in width directions of the first wiring board 21 by a certain dimension. Thus, the first wiring board 21 has stripe-like portions 52 each formed between an adjacent pair of cuts 51. That is, by making the cuts 51 in the substrate 29, stripe-like portions 52 are formed in portions of the substrate 29. Then, the stripe-like portions 52 are bent to form pressing portions 33 as shown in FIG. 10. In the first wiring board 21, other pressing portions 34 may be formed by bending the stripe-like portions 52 in an opposite direction. In other words, the pressing portions 33 and the other pressing portions 34 are formed by bending portions of the substrate 29 of the first wiring board 21.

FIGS. 11 and 12 show a first wiring board 21 according to the third embodiment. As shown in FIG. 11, a substrate 29 of the first wiring board 21 has a plurality of cuts 51 made therein. The cuts 51 are made from one side edge and the other side edge along the longitudinal direction of the first wiring board 21 each in a width direction of the first wiring board 21 by a certain dimension and then from its cut end, continuously in a longitudinal direction of the first wiring board 21 over a certain dimension. Thus, the first wiring board 21 has stripe-like portions 52 partitioned by the respective cuts 51. That is, by making the cuts 51 in the substrate 29, stripe-like portions 52 are formed in portions of the substrate 29. Then, the stripe-like portions 52 are bent to form pressing portions 33 as shown in FIG. 12. In the first wiring board 21, other pressing portions 34 may be formed by bending the stripe-like portions 52 in an opposite direction. In other words, the pressing portions 33 and the other pressing portions 34 are formed by bending portions of the substrate 29 of the first wiring board 21.

As described above, the first wiring board 21 according to each of the second and third embodiments, the pressing portions 33 and the other pressing portions 34 are formed from the cuts 51. Thus, an advantageous effect similar to that of the first embodiment can be obtained from the first wiring board 21 of each these embodiments.

FIG. 13 shows the fourth embodiment. The fourth embodiment is different from the first embodiment in the respect of the structure of an engaging portion 55 with which a pressing portion 33 of a first wiring board 21 engages to be hooked thereon. As shown in FIG. 13, the engaging portion 55 has a structure of recess formed in an inner surface 4*b* of a housing 4. The engaging portion 55 has a width larger than that of the pressing portion 33.

The pressing portion 33 engages with the inner surface of the engaging portion 55 in side edges 33*b* of a distal end portion 33*a* of the pressing portion 33, to be hooked thereon. With this structure, the engaging portion 55 of the fourth embodiment can exhibit a similar advantageous effect to that of the engaging portions 36*a* and 36*b* of the first embodiment.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus comprising:

a housing;

a circuit board in the housing comprising a first surface facing an inner surface of the housing and a second surface on an opposite side to the first surface;

a flexible printed wiring board comprising elasticity over the first surface and the second surface and electrically connected to the first surface of the circuit board; and pressing portions formed by bending a portion of the flexible printed wiring board, wherein the pressing portions are configured to press the flexible printed wiring board towards the first surface of the circuit board while being attached to the inner surface of the housing;

another pressing portion formed by bending a portion of the flexible printed wiring board, the other pressing portion being configured to press the flexible printed wiring board in a direction away from the circuit board while the other pressing portion is in contact with at least one of the first and second surfaces of the circuit board;

wherein the housing comprises conductivity;

wherein the flexible printed wiring board comprises a grounding pattern formed to reach the pressing portions; and wherein the grounding pattern is exposed outside the flexible printed wiring board at a location corresponding to a distal end portion of the pressing portions and grounded via the housing.

2. The electronic apparatus of claim 1, wherein the pressing portions extend from each of a first edge and a second edge of the flexible printed wiring board in a width direction of the flexible printed wiring board.

3. The electronic apparatus of claim 2, wherein:

the housing comprises an engaging portion configured to engage with at least a side edge of the distal end portion of the pressing portions.

4. A flexible printed wiring board to be electrically connected to a first surface of a circuit board comprising the first surface and a second surface on an opposite side to the first surface, the flexible printed wiring board being over the first surface and the second surface in a housing, and comprising:

a pressing portion bent to be attached to an inner surface of the housing facing the first surface of the circuit board; and other pressing portions bent to be attached to the first and second surfaces of the circuit board, wherein the other pressing portions are configured to press in a direction away from the circuit board;

a grounding pattern formed to reach the pressing portion, the grounding pattern being exposed at a location corresponding to a distal end portion of the pressing portions grounded via the housing;

wherein the pressing portion is configured to press towards the first surface.

* * * * *